United States Patent [19]

Yamasawa et al.

[11] Patent Number: 5,434,101
[45] Date of Patent: Jul. 18, 1995

[54] PROCESS FOR PRODUCING THIN FILM BY EPITAXIAL GROWTH

[75] Inventors: Kazuhito Yamasawa; Atsushi Oido; Akio Nakata; Nobuya Uchida, all of Tokyo, Japan

[73] Assignee: TDK Corporation, Tokyo, Japan

[21] Appl. No.: 25,193

[22] Filed: Mar. 2, 1993

[30] Foreign Application Priority Data

Mar. 2, 1992 [JP] Japan .................. 4-078765

[51] Int. Cl.[6] ............................ H01L 21/20
[52] U.S. Cl. .................... 437/128; 437/105; 437/125; 437/126; 437/133; 117/56; 117/89; 117/105; 148/33
[58] Field of Search ............. 156/600, 612, 624, 621; 148/33, DIG. 101; 437/125, 126, 128, 133, 105; 117/56, 89, 105

[56] References Cited

U.S. PATENT DOCUMENTS 4,269,651 5/1981 Glass et al. .................... 156/624
4,605,600 8/1974 Niigaki et al. ................. 428/689

FOREIGN PATENT DOCUMENTS 60-134415 7/1985 Japan .
60-235478 11/1985 Japan .
2051494 2/1990 Japan .................. 156/624
2094607 4/1990 Japan .
2097494 4/1990 Japan .................. 156/624

OTHER PUBLICATIONS

Tolksdorf et al. "Controlled lattice constant mismatch by compositional changes in LPE grown single crystal films of rare earth . . . Garnets on GGG substrates", Journal of Crys. Growth, vol. (17), 1972, pp. 322-328.

Primary Examiner—R. Bruce Breneman
Assistant Examiner—Ramamohan Rao
Attorney, Agent, or Firm—Seidel, Gonda, Lavorgna & Monaco

[57] ABSTRACT

In the manufacture of a single crystal film by epitaxial growth method, defects such as cracking are avoided by increasing the deviation of the lattice constant of the resulting film in the direction of growth from the substrate. Preferably, the deviation is increased at the rate of $(0.4 \sim 9) \times 10^{-4} \% / \mu m$.

7 Claims, 1 Drawing Sheet

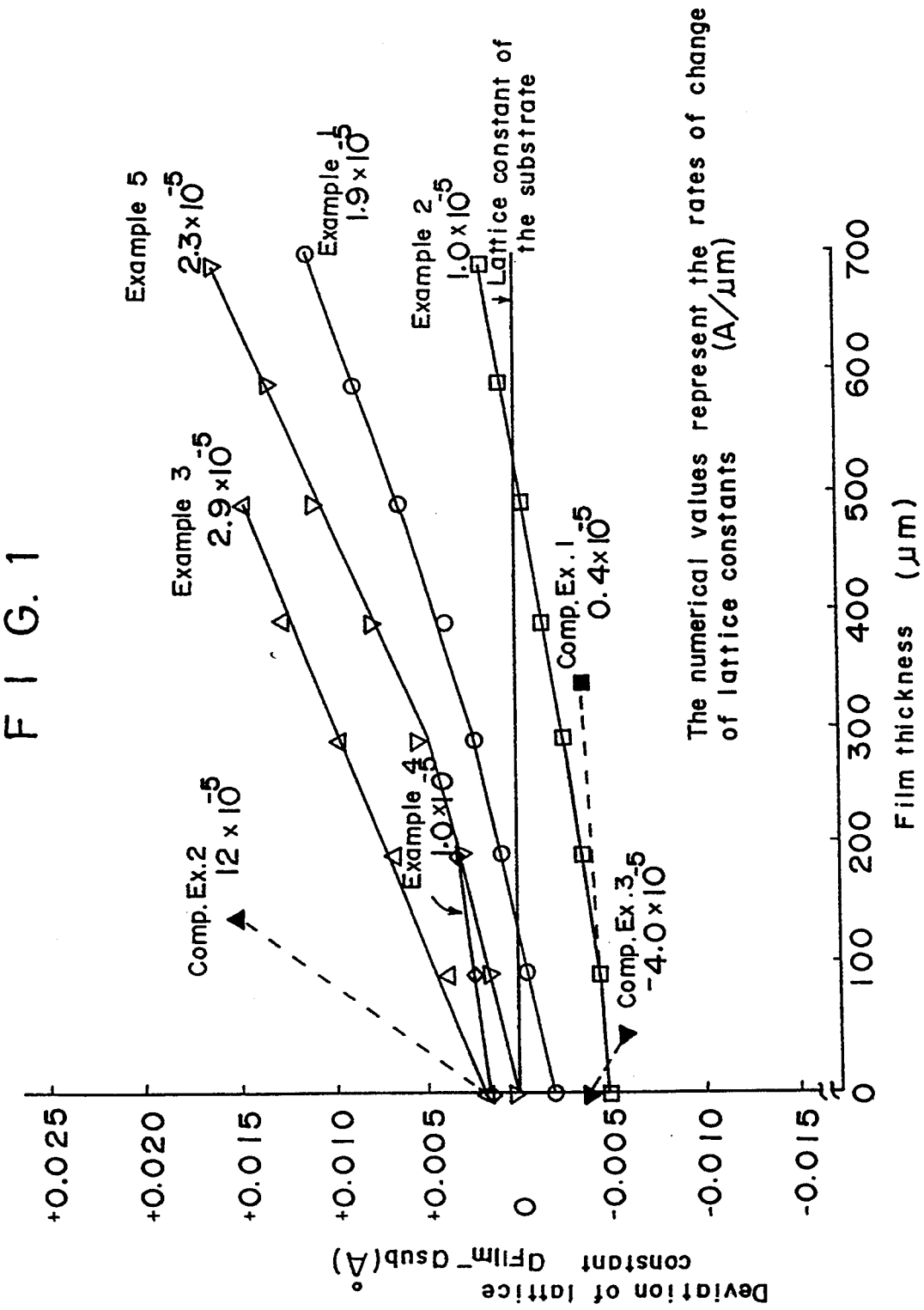

PROCESS FOR PRODUCING THIN FILM BY EPITAXIAL GROWTH

BACKGROUND OF THE INVENTION

This invention relates to a process for producing a single crystal film, and more specifically to a process for producing a single crystal film by epitaxy.

The epitaxial growth technology is expensively used in the manufacture of various single crystal films for diverse applications, such as semiconductors, optical elements, magnetic parts, and magnetooptic elements. For the desired crystal growth it involves the contact of liquid or gaseous material with the surface of a crystal substrate having a lattice constant close to that of the crystal to be grown. In this way, a high quality single crystal film can be made. For example, magnetic garnet, a well-known material for magnetooptic devices, e.g., Faraday rotation is produced by liquid-phase epitaxial growth (LPE) on single crystal substrate, such as (Ca,Mg,Zr)-substied GGG single crystal, so as to form thereon a film $\mu$m or more in thickness. The method uses a liquid phase material and effects its crystal growth.

When such a thick film is required, resses frequently develop between the substrate and the single crystal film, causing strains which, in extreme cases, crack the film. It has been believed possible to avoid this problem by ensuring as close an agreement as possible between the lattice constant of the crystal substrate and that of the crystal film. However, mere agreement in the lattice constant does not solve the problem satisfactorily because, in fact, other parameters including the chemical compositions, thicknesses, and thermal expansion coefficients of the substrate and the single crystal film have bearing upon the phenomenon. It has also been proposed that two types of films having lattice constants conforming to each other at different temperatures are alternately superposed but this method requires many steps and time-consuming.

BRIEF SUMMARY OF THE INVENTION

In view of the foregoing, the present invention has for its object to prevent stresses from being produced in the course of single crystal film growth by epitaxial growth on a crystal substrate, and thereby avert the cracking problem.

The invention provides a process for growing a single crystal film by epitaxial growth on a crystal substrate characterized in that initially the lattice constant of the substrate and that of the resulting single crystal film are made close to each other and, as the single crystal film grows, the deviation of the latter lattice constant of the crystal film from the initial value is intentionally increased at a suitable rate of change. In this case, the deviation of the lattice constant may be positive or negative. With a magnetic garnet, for example, the deviation of of the lattice constant of the single crystal film is positive as the film grows.

DETAILED DESCRIPTION OF THE DRAWING

FIG. 1 is a graph showing the relationship between the thickness of the crystal film and changes in the lattice constant in Example 1 to 5 that handled single crystal garnet.

DETAILED DESCRIPTION OF THE INVENTION

In FIG. 1 is illustrated how lattice constants were increased with the growth of magnetic garnet single crystal films, as will be explained in detail later. No crack resulted from the film growth, even to a thickness of 700 $\mu$m.

The process of the invention is predicated upon a surprising discovery that once the lattice constants of the substrate and the single crystal film were close to each other at the starting point, mutual deviation of the constants with the growth of the crystal would give favorable result contrary to the general belief. If the lattice constants were kept constant during the crystal growth as by conventional method, the frequency of cracking would be higher than with the process of the invention. The mechanism of this phenomenon is yet to be clarified but the applicant infers the following mechanism. Cracks are usually expected when the difference in lattice constant is sufficiently large between the substrate and the single crystal film, the growth temperature is sufficiently high and the thickness of the resulting crystal film is sufficiently large (for example, 100 $\mu$m or more for Bi-substituted garnet). Lacking of one or more of these conditions will suppress development of a large stress which could lead to cracks. During the initial stage of the crystal film deposition, if the initially-formed film portion has a lattice constant different from that of the substrate a curling is caused to occur by the so-called bi-metal effect. If deposition of the subsequent portion of the single crystal film is effected along the radius of the curvature, this radius of curvature is kept substantially constant and stabilized. In such case, the radius of the curvature corresponds to the constant change in the lattice constant of the crystal film. On the other hand, if a crystal film having a less variation of lattice constant than the lattice constant corresponding to the radius of curvature is grown on the surface (For example, if the crystal has a constant value), the lattice at a location close to the surface experiences a tensile stress in the case of convex toward the single crystal film (That is, the lattice constant of the film during initial stage of growth is larger than that of the substrate) or a compression stress in the case of concave toward the crystal film (That is, the lattice constant of the film is smaller than that of the substrate), whereby a crack is developed when the film thickness exceeds a certain level. Here, the deviation of the lattice constant during the initial stage of the crystal growth is caused by the difference in the thermal expansion between the substrate material and the film grown thereon. In other words, if the lattice constants are equalized at the room temperature, a large stress is developed if there is difference in the thermal expansion, leading to cracking at the growth temperature. On the other hand, if the lattice constants are equalized at the growth temperature, a large stress is developed if there is difference in the thermal expansion between the substrate material and the film grown thereon, leading to cracking when cooled to the room temperature after formation of the crystal film.

Bi-substituted garnet has a coefficient of thermal expansion larger by about $1 \times 10^{-E}/°$ C. than (Ca,Zr,Mg)-substituted GGG substrate. From this, the deviation of the lattice constant at the growth temperature (For example, at 800° C.) is calculated and then using the bi-metal model the radius of curvature at the initial film thickness(50 μm or less) is calculated to give about 1-2 m, which, in turn, gives $0.5-1 \times 10^{-4}$%/μm of deviation of the lattice constant. This value generally coincides with the experimental result.

To what extent the lattice constants of the substrate and the single crystal film should be close together at the starting point is not fully known, either. Generally, however, deviation up to about ±0.2% from complete agreement is permissible, and crack-free conditions can be easily determined for each crystalline material to be handled.

Changes in the lattice constant of a crystal film are effected through the control of the feed composition. In the LPE method, for example, the composition is adjusted in response to changes with time of the mixing ratio of the melt composition and of the growth temperature. In the CVD method, on the other hand, the compositional ratio of the feed gas being introduced into the vapor-phase film forming chamber is changed with time. In the PVD method, the composition may be varied by adjusting in time the power to be applied using the multi-target co-sputtering method.

To be more concrete, the process of the invention, e.g., for the manufacture of a Bi-substituted magnetic garnet single crystal film by the LPE method, is carried out as follows. Feedstock metered so as to give a composition $Bi_xR_{s-x}Fe_{5-w}M_wO_{12}$, in which R is one or more elements selected from the group consisting of Y, Ca, Pb, La, Ce, Pr, Nd, Sm, Eu, Gd, Tb, Dy, Ho, Er, Ti, Yb, and Lu; M is one or more elements selected from the group consisting of Al, Ga, In, Sc, Ti, Si, and Ge; and usually x and w are 0 to 2 each, is fed to form a crystal film by LPE method on a nonmagnetic single crystal substrate, e.g., of (Ca,Mg,Zr)-substituted GGG. In this way a Bi-substituted rare earth garnet material having near target crystallinity. With the lapse of time the growth temperature is lowered, the Bi proportion adjusted, and the lattice constant increased with the film thickness.

Recited as parameters which affect the lattice constant are the total amount of the melt, the surface area of the substrate and the rate of growth of the film. Recited as parameters which decide the rate of growth of the film are ratios $R_1$, $R_3$, $R_4$ and $R_5$ (generally called R parameters) of melt constituents as defined by the followings.

$R_1 = (Fe_2O_8 + M_2O_8)/\Sigma R_2O_3$, $R_3 = (Bi_2O_8 + PbO)/B_2O_8$, $R_4 = (Fe_2O_8 + M_2O_8 + \Sigma R_2O_3)/$Total amount, $R_5 = Bi_2O_8/PbO$.

More specifically, $R_1$ for a magnetic garnet is 5/3, while $R_1$ for a Bi-substituted garnet is set at 10 or more. Accordingly, with growth of the single crystal film on a substrate, $R_1$ increases and $R_3$, $R_4$ and $R_5$ decreases because the numerator of the latter three becomes smaller, although the changes are much smaller for $R_3$ and $R_5$. In order to produce a film having a thickness exceeding 100 μm, these parameters, particularly $R_1$ and $R_4$ cannot be neglected. Experience shows that $R_1$ increases and $R_4$ decreases at a fixed nurturing temperature that the quantity of Bi is decreased contained in the film, resulting in the reduction of the lattice constant of the film. Accordingly, when a film having a uniform composition, i.e. having the same lattice constant, throughout the thickness is to be produced, it is required to lower the growth temperature at a rate which takes these factors into consideration. On the other hand, when a film having lattice constants increasing in the direction of growth of the film, i.e. having increasing Bi content, it is required to lower the growth temperature at a rate greater than the just-mentioned rate.

As will be explained in the working examples below, it was found that a rate of change of the lattice constant within the range of $(0.4 \sim 9) \times 10^{-4}$%/ μm gives good result.

The present invention is also applicable to the films by epitaxy, for example, SiC and Si semiconductor films and other crystal films.

EXAMPLE 1

A composition consisting of $Bi_2O_3$, $Tb_4O_7$, $Nd_2O_3$ and $Fe_2O_3$ in a mixing ratio to give a magnetic garnet as below and a flux of PbO and $B_2O_3$ was used, and a single crystal of garnet having an average composition of $Bi_{0.7}Tb_{2.1}Nd_{0.2}Fe_5O_{12}$ having a lattice constant of 12.494 Å was formed by the LPE method at a temperature of 813° C. on a nonmagnetic single crystal substrate of (Ca,Mg,Zr)-substituted GGG having a lattice constant of 12.497 Å and a diameter of 2 inches. The total melt amount of 2 kg, $R_1=24$, $R_3=10$, $R_4=0.12$ and $R_5=0.3$ were the conditions.

Next, in the same way as described above, epitaxial growth was initiated at 813° C., and the resulting film was grown while the growth temperature was decreased at the rate of 0.6° C./hr and the lattice constant was changed at the rate of $1.9 \times 10^{-5}$ Å/μm ($1.5 \times 10^{-4}$ %/μm). The lattice constant values given here were measured at 25° C. (the same applying to the other examples). It was not until the resulting film was 700 μm thick when it cracked.

EXAMPLE 2

A feedstock similar to that of Example 1 was used, and a single crystal film of garnet of an average composition of $Bi_{0.8}Tb_{2.1}Nd_{0.1}Fe_5O_{12}$ having a lattice constant of 12.491 Å was formed by the LPE method at a temperature of 908° C. on a nonmagnetic single crystal substrate similar to the one used in the preceding example. The total melt amount of 10 kg, $R_1=26$, $R_3=10$, $R_4=0.18$ and $R_5=0.6$ were the conditions.

Next, in the same way as above, epitaxial growth was initiated at 908° C., and the resulting film was grown while the oven temperature was decreased at the rate of 0.1° C./hr until the film thickness reached 200 μm and at the rate of 0.3° C./hr from 200 μm onward and the lattice constant was changed at the rate of $1.0 \times 10^{-6}$ Å/μm ($0.8 \times 10^{-4}$ %/μm). The resulting film would not crack until it became 700 μm thick.

COMPARATIVE EXAMPLE 1

In Example 2 the epitaxial growth was effected in the following way. The growth was carried out while lowering the temperature at the rate of 0.1° C./hr and changing the lattice constant at the rate of $0.4 \times 10^{-5}$ Å/μm ($0.3 \times 10^{-4}$ %/μm). The resulting film cracked when it became 350 μm thick.

EXAMPLE 3

A composition consisting of $Bi_2O_3$, $Ho_2O_3$, $La_2O_3$, $Y_2O_3$, $Fe_2O_3$ and $Ga_2O_3$ in a mixing ratio to give a magnetic garnet as below and a flux of PbO and $B_2O_3$ was used, and a single single crystal film of $Bi_{1.4}Ho_{0.1}La_{0.2}Y_{0.4}Fe_{4.5}Ga_{0.5}O_{12}$ having a lattice constant of 12.504 Å was formed by the LPE method at a temperature of 745° C. on a nonmagnetic single crystal substrate of $Nd_3Ga_5O_{12}$ having a lattice constant of 12.502 Å. Next, in the same way as above, epitaxial growth was initiated at 745° C., and the resulting film was grown while the oven temperature was decreased at the rate of 1.2° C./hr and the lattice constant was changed at the rate of $2.9 \times 10^{-5}$ Å/μm ($2.3 \times 10^{-4}$ %/μm). It was not until the resulting film was 500 μm thick when it cracked.

COMPARATIVE EXAMPLE 2

In Example 3 the epitaxial growth was effected in the following way. The growth was conducted while lowering the temperature at the rate of 5.0° C./hr and changing the lattice constant at the rate of $12 \times 10^{-5}$ Å/μm ($10 \times 10^{-4}$ %/μm). The resulting film cracked when it became 150 μm thick.

EXAMPLE 4

A composition consisting of $Y_2O_3$, $La_2O_3$, $Ga_2O_3$ and $Fe_2O_3$ with a mixing ratio to give a magnetic garnet as below and a flux of PbO and $B_2O_3$ was used, and a single crystal film of an average composition of $Y_{2.3}La_{0.1}Fe_{4.5}Ga_{0.5}O_{12}$ having a lattice constant of 12.377 Å was formed by the LPE method at a temperature of 745° C. on a nonmagnetic single crystal substrate of GGG ($Gd_3Ga_5O_{12}$) having a lattice constant of 12.375 Å. Next, by the same procedure as described above, epitaxial growth was initiated at 745° C., and the resulting film was growth while the oven temperature was descreased at the rate of 1.2° C./hr and the lattice constant was changed at the rate of $1.0 \times 10^{-5}$ Å/μm ($0.8 \times 10^{-4}$ %/μm). It was not until the resulting film was 200 μm thick when it cracked.

EXAMPLE 5

A composition consisting of $Bi_2O_3$, $Ga_2O_3$, $Yb_2O_3$, $Fe_2O_3$ and $TiO_2$ in a mixing ratio to give a magnetic garnet as below and a flux of PbO and $B_2O_3$ was used, and a single crystal film of an average composition of $Bi_{1.0}Gd_{1.4}Yb_{0.6}Fe_{4.98}Ti_{0.05}O_{12}$ having a lattice constant of 12.495 Å was formed by the LPE method at a temperature of 745° C. on a nonmagnetic single crystal substrate of (Ca,Mg,Zr)-substituted GGG having a lattice constant of 12.497 Å. Next, by the same procedure as described above, epitaxial growth was initiated at 745° C., and the resulting film was grown while the growth temperature was decreased at the rate of 1.2° C./hr and the lattice constant was changed at the rate of $2.3 \times 10^{-5}$ Å/μm ($1.8 \times 10^{-4}$ %/μm). The film resisted cracking until it was 700 μm thick.

COMPARATIVE EXAMPLE 3

In Example 5 the epitaxial growth was effected in the following way. The growth was carried out while maintaining the temperature constant at 750° C. and changing the lattice constant at the rate of $-4.0 \times 10^{-5}$ Å/μm ($3.2 \times 10^{-4}$ %/μm). The resulting film cracked when it became 50 μm thick.

These examples and comparative examples demonstrate that the stress development can be avoided and hence cracking be prevented by formulating the crystal film to be grown so that its lattice constant is close to that of the substrate and setting the rate of change within the specific range of $(0.4 \sim 9) \times 10^{-4}$ %/μm. Incidentally, although the present specification does not specifically refer to impurities, it should be noted that the single crystal film according to the present invention contains a trace of unavoidable impurities such as Pt, Pb, originating from the flux, crucible and the starting materials.

As is clear from the foregoing examples, the present invention renders it possible to preclude stress development and cracking during the course of single crystal film formation by epitaxial growth on a crystal substrate.

What is claimed is:

1. A single crystal film obtained by epitaxial growth on a single crystal substrate in which said single crystal film has a lattice constant with a deviation continuously increased in the direction of growth from the substrate.

2. The film of claim 1 in which the deviation of the lattice constant is increased at the rate of change of $0.4 \times 10^{-4}$ %/μm $- 9 \times 10^{-4}$ %/μm.

3. The film of claim 2 wherein the crystal film is a magnetic garnet.

4. The film of claim 3 wherein the film has been grown by liquid phase epitaxy.

5. The film of any one of claims 1 to 4 wherein the film has a thickness of 100 μm or more.

6. A single crystal film according to claim 1, wherein the lattice constant of the single crystal film (is close to) and the lattice constant of the substrate at the interface of the substrate deviate from each other by not more than ±0.2% and the deviation of the lattice constant of the single crystal film increases in the direction of growth from the substrate.

7. The film of claim 6 in which the single crystal film has a gradient of composition in the direction of the growth from the substrate.

* * * * *